United States Patent
Paek et al.

(10) Patent No.: US 10,230,066 B2
(45) Date of Patent: Mar. 12, 2019

(54) ORGANIC LIGHT EMITTING DISPLAY DEVICE HAVING BANKS AND METHOD OF MANUFACTURING THE SAME

(71) Applicant: LG Display Co., Ltd., Seoul (KR)

(72) Inventors: SeungHan Paek, Seoul (KR); YoungMu Oh, Seoul (KR); Jeongwon Lee, Gyeonggi-do (KR); Heonll Song, Gyeonggi-do (KR); Jonghoon Yeo, Gyeonggi-do (KR); Jihoon Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/621,056

(22) Filed: Jun. 13, 2017

(65) Prior Publication Data
US 2018/0006259 A1 Jan. 4, 2018

(30) Foreign Application Priority Data
Jun. 30, 2016 (KR) .................. 10-2016-0083112

(51) Int. Cl.
*H01L 51/52* (2006.01)
*H01L 51/00* (2006.01)
*H01L 27/32* (2006.01)

(52) U.S. Cl.
CPC ...... *H01L 51/5203* (2013.01); *H01L 51/0096* (2013.01); *H01L 51/5215* (2013.01); *H01L 27/32* (2013.01); *H01L 51/5296* (2013.01)

(58) Field of Classification Search
CPC ............. H01L 51/5203; H01L 51/5215; H01L 51/0096; H01L 51/5296; H01L 27/32
See application file for complete search history.

(56) References Cited

U.S. PATENT DOCUMENTS

| | | | |
|---|---|---|---|
| 8,569,763 B2* | 10/2013 | Nendai | H01L 51/5209 257/59 |
| 9,076,739 B2* | 7/2015 | Choi | H01L 27/3246 |
| 2013/0038203 A1* | 2/2013 | Kim | H01L 51/5215 313/504 |
| 2013/0105781 A1* | 5/2013 | Matsushima | H01L 27/3258 257/40 |
| 2015/0060820 A1 | 3/2015 | Takagi et al. | |
| 2015/0236073 A1 | 8/2015 | Chen et al. | |
| 2016/0035802 A1 | 2/2016 | Wang et al. | |

FOREIGN PATENT DOCUMENTS

| | | |
|---|---|---|
| CN | 103545457 A | 1/2014 |
| CN | 103840092 A | 6/2014 |
| CN | 104425766 A | 3/2015 |

OTHER PUBLICATIONS

Chinese Office Action dated Sep. 5, 2018, in corresponding Chinese Patent Application No. 201710480214.7.

\* cited by examiner

*Primary Examiner* — Tracie Y Green
(74) *Attorney, Agent, or Firm* — Morgan, Lewis & Bockius LLP

(57) ABSTRACT

An organic light emitting display device and a method of manufacturing the same are provided in which a separate photomask process is not added, a pile-up phenomenon of an organic layer is prevented, and a device characteristic is improved. The organic light emitting display device includes a plurality of banks in a boundary portion of a pixel area on a base substrate, an anode electrode in a pixel area on the base substrate, an organic layer on the anode electrode, and a cathode electrode on the organic layer and the plurality of banks.

11 Claims, 8 Drawing Sheets

ORGANIC LIGHT EMITTING DISPLAY DEVICE HAVING BANKS AND METHOD OF MANUFACTURING THE SAME

CROSS-REFERENCE TO RELATED APPLICATIONS

This application claims the benefit of the Korean Patent Application No. 10-2016-0083112 filed on Jun. 30, 2016, which is hereby incorporated by reference as if fully set forth herein.

BACKGROUND

Technical Field

The present disclosure relates to an organic light emitting display device and a method of manufacturing the same.

Discussion of the Related Art

With the advancement of information-oriented society, various requirements for display devices for displaying an image are increasing. Therefore, various display devices such as liquid crystal display (LCD) devices, plasma display panel (PDP) devices, organic light emitting display devices, etc. are being used recently.

In such display devices, the organic light emitting display devices are self-emitting devices and have low power consumption, a fast response time, high emission efficiency, high luminance, and a wide viewing angle, thereby attracting attention as next-generation display devices.

Organic light emitting display devices of the related art are manufactured through a dry etching process using vacuum deposition. However, a number of organic light emitting display devices are recently manufactured through a wet etching process using an inkjet printing process, instead of the wet etching process.

Organic light emitting display devices manufactured through the wet etching process include a base substrate, a thin film transistor (TFT), and an organic light emitting device. A plurality of gate lines and a plurality of data lines are arranged on the base substrate and intersect each other to define a plurality of pixel areas. The TFT is included in each of the plurality of pixel areas.

The organic light emitting device is provided on the TFT and is electrically connected to the TFT. The organic light emitting device includes an anode electrode, an organic layer, and a cathode electrode. The anode electrode is electrically connected to the TFT. A bank is provided between adjacent anode electrodes. The bank insulates the adjacent anode electrodes. The organic layer is provided on the anode electrode. An organic light emitting material having a solution state is dripped, and then, by drying the organic light emitting material, the organic layer is formed. The cathode electrode is provided on the organic layer and the bank.

However, in a related art organic light emitting display device manufactured through the inkjet printing process, a pile-up phenomenon where a thickness of the organic layer is thicker near a boundary surface adjacent to the bank than a center of a pixel area occurs.

In order to prevent the pile-up phenomenon, a method where an auxiliary bank having hydrophilicity is provided between the anode electrode and the bank has been proposed, but in this case, a separate photomask process is added. Also, the anode electrode is damaged by an etching solution which is used in a process of etching the auxiliary bank, and for this reason, a characteristic of an organic light emitting display device is degraded.

SUMMARY

Accordingly, embodiments of the present disclosure are directed to an organic light emitting display device and a method of manufacturing the same that substantially obviates one or more of the problems due to limitations and disadvantages of the related art.

An aspect of the present disclosure is to provide an organic light emitting display device and a method of manufacturing the same, in which a separate photomask process is not added, a pile-up phenomenon of an organic layer is prevented, and a device characteristic is improved.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, an organic light emitting display device comprises a plurality of banks in a boundary portion of a pixel area on a base substrate, an anode electrode in a pixel area on the base substrate, an organic layer on the anode electrode, and a cathode electrode on the organic layer and the plurality of banks. In this case, the anode electrode is provided between the plurality of banks and covers a side surface of each of the plurality of banks adjacent to the anode electrode.

In another aspect, a method of manufacturing an organic light emitting display device comprises forming a plurality of banks in a boundary portion of a pixel area on a base substrate, forming an anode electrode in a pixel area on the base substrate, forming an organic layer by dripping and drying an organic light emitting material on the anode electrode, and forming a cathode electrode on the organic layer and the plurality of banks. In this case, the anode electrode is provided between the plurality of banks and covers a side surface of each of the plurality of banks adjacent to the anode electrode.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
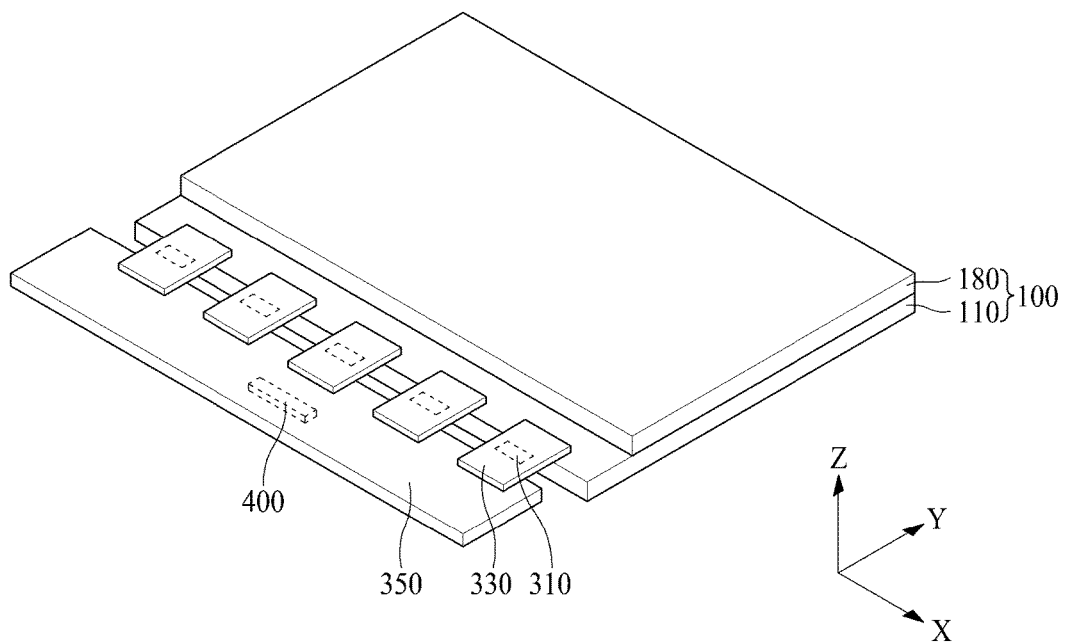
FIG. 1 is a perspective view illustrating an organic light emitting display device according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

The terms described in the specification should be understood as follows.

The terms described in the specification should be understood as follows. As used herein, the singular forms "a", "an" and "the" are intended to include the plural forms as well, unless the context clearly indicates otherwise. The terms "first" and "second" are for differentiating one element from the other element, and these elements should not be limited by these terms. It will be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The term "on" should be construed as including a case where one element is formed at a top of another element and moreover a case where a third element is disposed therebetween.

Hereinafter, exemplary embodiments of an organic light emitting display device and a method of manufacturing the same according to the present disclosure will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present disclosure, the detailed description will be omitted.

Figure 2:
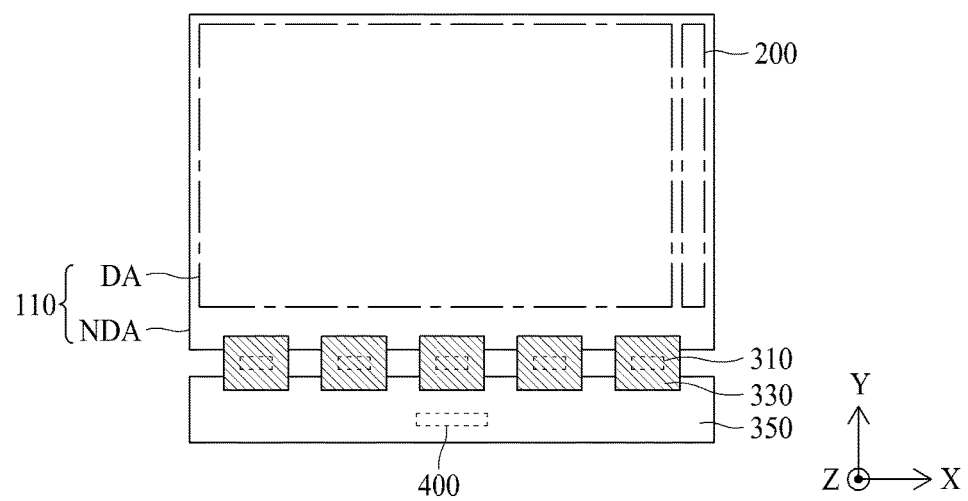
FIG. 2 is a plan view illustrating a base substrate, a gate driver, a source drive integrated circuit (IC), a flexible film, a circuit board, and a timing controller of FIG. 1.

FIG. 1 is a perspective view illustrating an organic light emitting display device according to an embodiment of the present disclosure. FIG. 2 is a plan view illustrating a base substrate, a gate driver, a source drive integrated circuit (IC), a flexible film, a circuit board, and a timing controller of FIG. 1. In FIGS. 1 and 2, the X axis indicates a direction parallel to a gate line, the Y axis indicates a direction parallel to a data line, and the Z axis indicates a height direction of the organic light emitting display device.

With reference to FIGS. 1 and 2, the organic light emitting display device according to an embodiment of the present disclosure may include a display panel 100, a gate driver 200, a source drive IC 310, a flexible film 330, a circuit board 350, and a timing controller 400.

The display panel 100 may include a base substrate 110 and an encapsulation layer 180. A plurality of gate lines, a plurality of data lines, and a plurality of pixels may be provided on one surface of the base substrate 100 facing the encapsulation layer 180. The pixels may each include a plurality of subpixels, and the plurality of subpixels may be respectively provided in a plurality of intersection areas between the gate lines and the data lines.

Each of the plurality of subpixels may include at least one thin film transistor (TFT) and an organic light emitting device. When the at least one TFT is turned on by a gate signal of a corresponding gate line, each of the plurality of subpixels may be supplied with a data voltage through a corresponding data line. Each of the plurality of subpixels may control a current flowing to the organic light emitting device according to the data voltage, thereby allowing the organic light emitting device to emit light having certain brightness.

The display panel 100, as in FIG. 2, may be divided into a display area DA displaying an image and a non-display area NDA that does not display an image. The gate lines, the data lines, and the pixels may be provided in the display area DA. The gate driver 200 and a plurality of pads may be provided in the non-display area NDA. The display panel 100 according to embodiments of the present disclosure will be described in detail with reference to FIGS. 3 to 6.

The gate driver 200 may sequentially supply gate signals to the gate lines according to a gate control signal input from the timing controller 400. The gate driver 200 may be provided in a gate driver-in panel (GIP) type in the non-display area NDA outside one side or both sides of the display area DA of the display panel 100. Alternatively, the gate driver 200 may be manufactured as a driving chip and may be mounted on the flexible film 330, or may be attached on the non-display area NDA outside the one side or the both sides of the display area DA of the display panel 100 in a tape automated bonding (TAB) type.

The source drive IC 310 may receive digital video data and a source control signal from the timing controller 400. The source driver IC 310 may convert the digital video data into analog data voltages according to the source control signal and may respectively supply the analog data voltages to the data lines. If the source drive IC 310 is manufactured as a driving chip, the source drive IC 310 may be mounted on the flexible film 330 in a chip-on film (COF) type or a chip-on plastic (COP) type.

A plurality of pads such as data pads may be provided in the non-display area NDA of the display panel 100. A plurality of lines connecting the pads to the source drive IC 310 and a plurality of lines connecting the pads to lines of the circuit board 350 may be provided on the flexible film 330. The flexible film 330 may be attached on the pads by using an anisotropic conductive film, and thus, the pads may be connected to the lines of the flexible film 330.

The circuit board 350 may be attached on the flexible film 330 which is provided in plurality. A plurality of circuits implemented as driving chips may be mounted on the circuit board 350. For example, the timing controller 400 may be mounted on the circuit board 350. The circuit board 350 may be a printed circuit board (PCB) or a flexible printed circuit board (FPCB).

The timing controller 400 may receive the digital video data and a timing signal from an external system board (not shown) through cables of the circuit board 350. The timing controller 400 may generate a gate control signal for controlling an operation timing of the gate driver 200 and a source control signal for controlling the source drive IC 310 which is provided in plurality, based on the timing signal. The timing controller 400 may supply the gate control signal to the gate driver 200 and may supply the source control signal to the plurality of source drive ICs 310.

Figure 3:
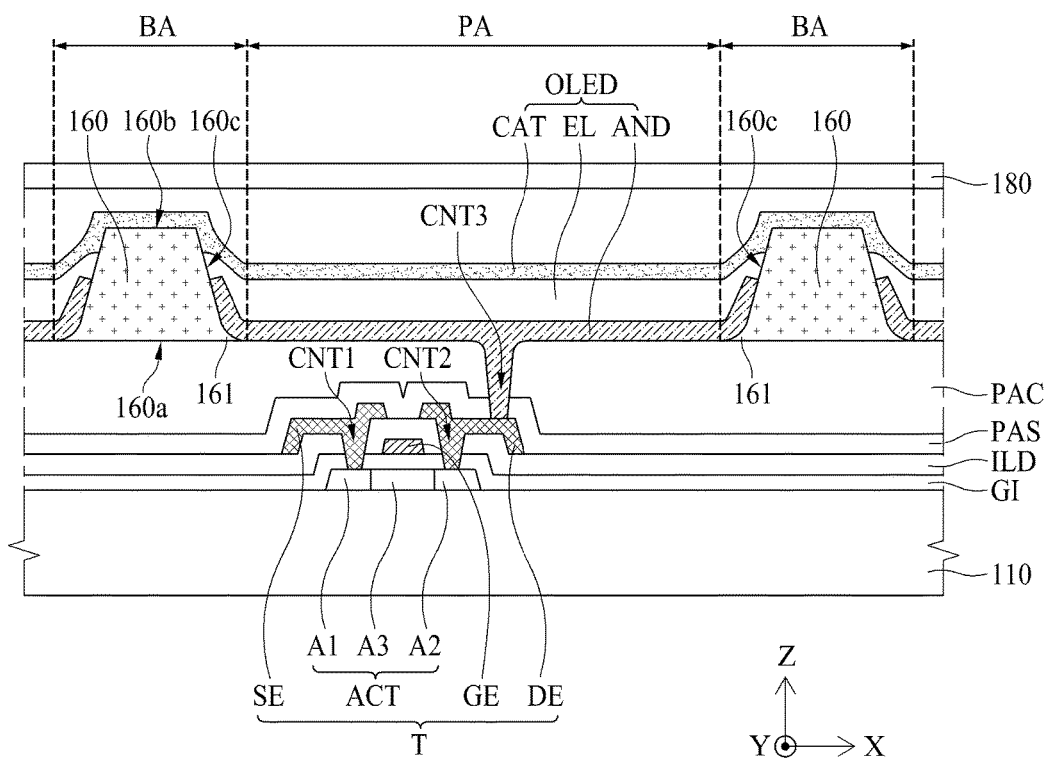
FIG. 3 is a cross-sectional view illustrating one cross-sectional surface of an organic light emitting display device according to an embodiment of the present disclosure.

FIG. 3 is a cross-sectional view illustrating one cross-sectional surface of an organic light emitting display device according to an embodiment of the present disclosure.

With reference to FIG. 3, the organic light emitting display device according to an embodiment of the present disclosure may include a base substrate 110, a TFT T, a passivation layer PAS, a planarization layer PAC, a bank 160, an organic light emitting device OLED, and an encapsulation layer 180.

The base substrate 110 may each be a glass substrate or a plastic substrate. For example, the base substrate 110 may be a sheet or a film which includes cellulose resin such as triacetyl cellulose (TAC), diacetyl cellulose (DAC), or the like, cyclo olefin polymer (COP) such as norbornene derivatives or the like, acryl resin such as cyclo olefin copolymer (COC), poly(methylmethacrylate) (PMMA), or the like, polyolefin such as polycarbonate (PC), polyethylene (PE), polypropylene (PP), or the like, polyester such as polyvinyl alcohol (PVA), poly ether sulfone (PES), polyetheretherketone (PEEK), polyetherimide (PEI), polyethylenenaphthalate (PEN), polyethyleneterephthalate (PET), or the like, polyimide (PI), polysulfone (PSF), fluoride resin, and/or the like, but is not limited thereto.

The TFT T may be provided on the base substrate 110. The TFT T may include an active layer ACT, a gate insulation layer GI, a gate electrode GE, an interlayer dielectric ILD, a source electrode SE, and a drain electrode DE.

The active layer ACT may be provided on the base substrate 110. The active layer ACT may be disposed to overlap the gate electrode GE. The active layer ACT may include one area A1 disposed adjacent to the source electrode SE, another area A2 disposed adjacent to the drain electrode DE, and a center area A3 disposed between the one area A1 and the other area A2. The center area A3 may include a semiconductor material on which a dopant is not doped, and the one area A1 and the other area A2 may include a semiconductor material with a dopant doped thereon.

The gate insulation layer GI may be provided on the active layer ACT. The gate insulation layer GI may insulate the active layer ACT from the gate electrode GE. The gate insulation layer GI may be provided to cover the active layer ACT. The gate insulation layer GI may be formed of an inorganic insulating material, for example, silicon dioxide ($SiO_2$), silicon nitride (SiNx), and silicon oxynitride (SiON), or a multilayer thereof, but is not limited thereto.

The gate electrode GE may be provided on the gate insulation layer GI. The gate electrode GE may overlap the center area A3 of the active layer ACT with the gate insulation layer GI therebetween. The gate electrode GE may be a single layer or a multilayer including, for example, one of molybdenum (Mo), aluminum (Al), chromium (Cr), gold (Au), titanium (Ti), nickel (Ni), neodymium (Nd), and copper (Cu) or an alloy thereof, but is not limited thereto.

The interlayer dielectric ILD may be provided on the gate electrode GE. The interlayer dielectric ILD may be provided all over the base substrate 110 including the gate electrode GE. The interlayer dielectric ILD may be formed of an inorganic insulating material (for example, silicon dioxide ($SiO_2$), silicon nitride (SiNx), and silicon oxynitride (SiON), or a multilayer thereof) which is the same as that of the gate insulation layer GI, but is not limited thereto.

The source electrode SE and the drain electrode DE may be disposed on the interlayer dielectric ILD and may be spaced apart from each other. A first contact hole CNT1, exposing a portion of the one area A1 of the active layer ACT, and a second contact hole CNT2 which exposes a portion of the other area A2 of the active layer ACT may be provided in the gate insulation layer GI and the interlayer dielectric ILD. The source electrode SE may be connected to the one area A1 of the active layer ACT through the first contact hole CNT1, and the drain electrode DE may be connected to the other area A2 of the active layer ACT through the second contact hole CNT2. The source electrode SE and the drain electrode DE may each be a single layer or a multilayer including, for example, one of molybdenum (Mo), aluminum (Al), chromium (Cr), gold (Au), titanium (Ti), nickel (Ni), neodymium (Nd), and copper (Cu) or an alloy thereof, but is not limited thereto.

The TFT T may be provided in each of a plurality of pixel areas on the base substrate 110. A configuration of the TFT T is not limited to the above-described embodiment and may be variously modified into a configuration capable of being easily realized by those skilled in the art.

The passivation layer PAS may be provided on the TFT T. The passivation layer PAS may protect the TFT T. The passivation layer PAS may be formed of an inorganic insulating material, for example, silicon dioxide ($SiO_2$), silicon nitride (SiNx), and silicon oxynitride (SiON), or a multilayer thereof, but is not limited thereto.

The planarization layer PAC may be provided on the passivation layer PAS. The planarization layer PAC may planarize an upper surface of the base substrate 110 on which the TFT T is provided. The planarization layer PAC may be formed of an organic insulating material, for example, acryl resin, epoxy resin, phenolic resin, polyamides resin, polyimides resin, and/or the like, but is not limited thereto.

A third contact hole CNT3, which exposes the drain electrode DE of the TFT T, may be provided in the passivation layer PAS and the planarization layer PAC. The drain electrode DE may be electrically connected to an anode electrode AND of the organic light emitting device OLED through the third contact hole CNT3.

The bank 160 may be provided in plurality, and the plurality of banks 160 may be provided on the planarization layer PAC. The banks 160 may each be provided in a boundary portion BA of a pixel area PA on the base substrate 110. Each of the banks 160 according to an embodiment may have a taper structure where a length of a lower surface 160a is longer than that of an upper surface 160b. The taper structure may be defined as a structure where both side surfaces are inclined with respect to a center line. Therefore, side surfaces 160c of each of the banks 160 may be inclined.

In an embodiment of the present disclosure, since each of the banks 160 has the taper structure and the side surfaces 160c of each of the banks 160 are inclined, the anode electrode AND may extend along the side surfaces 160c of each of the banks 160 from the planarization layer PAC without being short-circuited.

Moreover, each of the banks 160 according to an embodiment may include a protrusion 161. The protrusion 161 may be defined as an end of the bank 160 which protrudes in a direction from the side surface 160c contacting the lower surface 160a to the pixel area PA. The anode electrode AND may be provided on the protrusion 161. That is, the anode electrode AND may cover the protrusion 161.

In an embodiment of the present disclosure, since the protrusion 161 is provided, the anode electrode AND may be gently provided along the side surface 160c of the bank 160 in comparison with a case where the protrusion 161 is not provided. Therefore, a problem where a thickness of an organic layer EL is thicker in a boundary portion contacting the bank 160 than a center portion of a pixel area is solved.

The banks 160 are low in surface energy, and thus, may be formed of a material (for example, an organic insulating material such as polyimides resin, acryl resin, or benzocyclobutene (BCB) having hydrophobicity) having no affinity with a below-described organic light emitting material having a solution state, but is not limited thereto. In an embodiment of the present disclosure, the banks 160 may be formed of a material having hydrophobicity, and thus, in a process of dripping the organic light emitting material, the organic light emitting material is prevented from overflowing to a top of each of the banks 160.

The organic light emitting device OLED may be provided on the TFT T. The organic light emitting device OLED may include the anode electrode AND, the organic layer EL, and a cathode electrode CAT.

The anode electrode AND may be provided on the planarization layer PAC. The anode electrode AND may be provided in the pixel area on the base substrate 110. The anode electrode AND may be connected to the drain electrode DE of the TFT T through the third contact hole CNT3 which is provided in the passivation layer PAS and the planarization layer PAC. The bank 160 may be provided between adjacent anode electrodes AND, and thus, the adjacent anode electrodes AND may be electrically insulated from each other.

The anode electrode AND according to an embodiment may be provided between adjacent banks 160 and may cover the side surfaces 160c of each of the adjacent banks 160. The anode electrode AND may cover the protrusion 161 provided in a lower end of each of the banks 160. The anode electrode AND may be provided on the planarization layer PAC exposed between the adjacent banks 160 and may cover a portion of each of the side surfaces 160c of the banks 160. In this case, the anode electrode AND may not be provided on an upper surface 160b of each of the banks 160. If the anode electrode AND extends to the upper surface 160b of each of the banks 160, an organic light emitting material can overflow in a process of dripping the organic light emitting material. In order to prevent the overflow, the anode electrode AND according to an embodiment of the present disclosure may not be provided on the upper surface 160c of each of the banks 160.

The anode electrode AND may be formed of a transparent conductive material (for example, indium tin oxide (ITO) or indium zinc oxide (IZO)) which is relatively large in work function value. However, the present embodiment is not limited thereto. In other embodiments, the anode electrode AND may be formed of two or more layers including a metal material (for example, Al, Ag, Ag;Pb;Cu (APC), etc.) which is good in reflective efficiency. The anode electrode AND is high in surface energy, and thus, has affinity with a below-described organic light emitting material having a solution state. Accordingly, a spreadability of the organic light emitting material which is in a solution state and is dripped on the anode electrode AND is enhanced.

In the related art, the anode electrode AND is first provided in plurality, and then, the banks 160 are each provided between two adjacent anode electrodes AND of the plurality of anode electrodes AND. In this case, a bank residual material which is not removed in a process of patterning the banks 160 can remain on the anode electrode AND. When the bank residual material remains on the anode electrode AND, the organic light emitting material cannot be dripped on a portion where the bank residual material remains. For this reason, a defective image quality of the organic light emitting display device occurs.

On the other hand, according to an embodiment of the present disclosure, the banks 160 may be first provided on the planarization layer PAC, and the anode electrodes AND may each be provided between two adjacent banks 160 of the plurality of banks 160, thereby preventing a bank residual material from remaining on the anode electrode AND. Accordingly, a defective image quality of the organic light emitting display device is improved.

The organic layer EL may be provided in the pixel area PA on the base substrate 110. The organic layer EL may be provided on the anode electrode AND. An organic light emitting material having a solution state may be dripped on the anode electrode AND, and then, by drying the organic light emitting material, the organic layer EL may be formed.

The organic layer EL may have a structure including a hole injecting layer, a hole transporting layer, an organic light emitting layer, an electron transporting layer, and an electron injecting layer. Furthermore, the organic layer EL may further include one or more function layers for enhancing the emission efficiency and/or lifetime of the organic light emitting layer. In this case, the hole injecting layer, the organic light emitting layer, and the hole transporting layer may be provided on the anode electrode AND by using a solution process. Also, the electron transporting layer and the electron injecting layer may be sequentially provided on the organic light emitting layer through vacuum deposition. However, the present embodiment is not limited thereto.

The organic layer EL according to an embodiment may cover a whole top of the anode electrode AND. The organic layer EL may cover one end and the other end of the anode electrode AND. In this case, the hole injecting layer of the organic layer EL may be provided to cover the whole top of the anode electrode AND.

According to an embodiment of the present disclosure, since the organic layer EL is provided to cover the whole top of the anode electrode AND, the one end and the other end of the anode electrode AND are not exposed to the outside. Accordingly, a leakage current does not occur in the one end and the other end of the anode electrode AND.

The cathode electrode CAT may be provided all over the base substrate 110. The cathode electrode CAT may be provided to cover a top of each of the organic layer EL and the bank 160. When a voltage is applied to the cathode electrode CAT and the anode electrode AND, a hole and an electron may respectively move to the organic light emitting layer through the hole transporting layer and the electron transporting layer and may be combined with each other to emit light in the organic light emitting layer.

The encapsulation layer 180 may be provided on the organic light emitting device OLED. The encapsulation layer 180 protects the TFT T and the organic light emitting device OLED from an external impact. Also, the encapsulation layer 180 prevents water from penetrating into the display panel 100.

In the drawings, a top emission structure has been described above as an example of the present disclosure, but is not limited thereto.

In the relate art, after the anode electrodes AND are first provided, the bank 160 is provided in a boundary portion between adjacent anode electrodes AND, and after an organic light emitting material having a solution state is dripped on the anode electrode AND, by drying the organic light emitting material, the organic layer EL is formed. In this case, a pile-up phenomenon where a thickness of the organic layer EL is thicker near a boundary surface adjacent to the bank than a center of a pixel area occurs. In order to prevent the pile-up phenomenon, a method where an auxiliary bank having hydrophilicity is provided between the anode electrode and the bank has been proposed. However, in a case where the auxiliary bank is provided, a separate photomask process is added. Also, the anode electrode is damaged by an etching solution which is used in a process of etching the auxiliary bank, and for this reason, a characteristic of an organic light emitting display device is degraded. Also, since the auxiliary bank is provided to cover one side of the anode electrode, an aperture ratio of the display panel is reduced.

However, in an embodiment of the present disclosure, the anode electrode AND may be provided between adjacent banks 160 to cover the side surfaces 160c of the banks 160, and the organic layer EL may cover the whole top of the anode electrode AND. Accordingly, a spreadability of an organic light emitting material is enhanced, thereby preventing a pile-up phenomenon where a thickness of the organic layer EL is thicker in a boundary surface contacting the bank 160 than a center of a pixel area. That is, when the organic light emitting material having a liquid state is dripped on the anode electrode AND, the anode electrode AND may have affinity with the organic light emitting material, and thus, a spreadability of the organic light emitting material is enhanced. Accordingly, the pile-up phenomenon where the thickness of the organic layer EL is thicker in the boundary surface contacting the bank 160 than the center of the pixel area is prevented.

Figure 4:
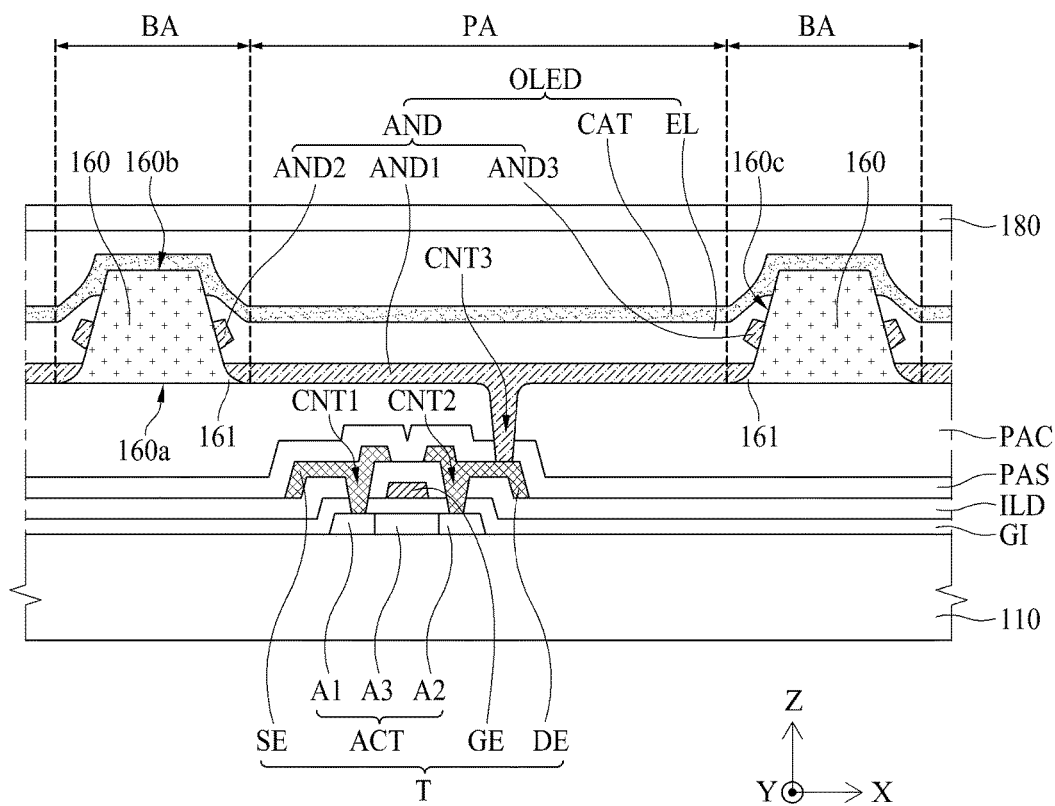
FIG. 4 is a cross-sectional view illustrating one cross-sectional surface of an organic light emitting display device according to another embodiment of the present disclosure.

Moreover, in an embodiment of the present disclosure, since the pile-up phenomenon is prevented without an auxiliary bank being provided, a separate mask process is not added. Also, an anode electrode is prevented from being damaged by an etching solution which is used in a process of etching the auxiliary bank, and thus, a device characteristic of an organic light emitting display device is improved. Also, according to an embodiment of the present disclosure, an aperture ratio of a display panel is not reduced in comparison with the related art where the auxiliary bank is provided. FIG. 4 is a cross-sectional view illustrating one cross-sectional surface of an organic light emitting display device according to another embodiment of the present disclosure. Except that an anode electrode AND includes first to third anode electrodes AND1 to AND3, the first anode electrode AND1 covers a protrusion 161 of each of banks 160, and the second and third anode electrodes AND2 and AND3 are respectively provided on side surfaces 160c of the banks 160, the organic light emitting display device according to another embodiment of the present disclosure is the same as an embodiment of the present disclosure described above. Thus, like reference numerals refer to like elements, and repetitive descriptions of a material and a structure of each element are omitted.

With reference to FIG. 4, an anode electrode AND according to another embodiment of the present disclosure may include first to third anode electrodes AND1 to AND3. The first anode electrode AND1 may be provided on a planarization layer PAC. The first anode electrode AND1 may be provided in a pixel area on a base substrate 110. The first anode electrode AND1 may be connected to a drain electrode DE of a TFT T through a third contact hole CNT3 which is provided in a passivation layer PAS and the planarization layer PAC. The first anode electrode AND1 according to an embodiment may cover the protrusion 161 included in each of a plurality of banks 160.

The second anode electrode AND2 may be spaced apart from one end of the first anode electrode AND1 by a certain distance. The second anode electrode AND2 may be provided on a side surface 160c of the bank 160 adjacent to the one end of the first anode electrode AND1 among the banks 160. The third anode electrode AND3 may be spaced apart from the other end of the first anode electrode AND1 by a certain distance. The third anode electrode AND3 may be provided on a side surface 160c of the bank 160 adjacent to the other end of the first anode electrode AND1 among the banks 160. The first to third anode electrodes AND1 to AND3 are high in surface energy, and thus, have affinity with a below-described organic light emitting material having a solution state. Accordingly, a spreadability of the organic light emitting material which is in a solution state and is dripped on each of the first to third anode electrodes AND1 to AND3 is enhanced.

In another embodiment of the present disclosure, the banks 160 may be first provided on the planarization layer PAC, and the anode electrode AND may be provided between adjacent banks 160, thereby preventing a bank residual material from remaining on the anode electrode AND. Accordingly, a defective image quality of the organic light emitting display device is improved.

The organic layer EL according to another embodiment of the present disclosure may cover a whole top of the first anode electrode AND1. Particularly, the organic layer EL may cover the one end and the other end of the first anode electrode AND1. Therefore, the one end and the other end of the first anode electrode AND1 are not exposed to the outside. Accordingly, according to another embodiment of the present disclosure, a leakage current is more stably prevented from occurring in one end and the other end of the anode electrode AND than an embodiment of the present disclosure.

Moreover, the organic layer EL may cover a whole top of each of the second and third anode electrodes AND2 and AND3. Therefore, according to another embodiment of the present disclosure, a spreadability of an organic light emitting material having a solution state is more enhanced than the related art where the organic light emitting material is dripped on each of the side surfaces 160c of the banks 160 having hydrophobicity. Accordingly, according to another embodiment of the present disclosure, the spreadability of the organic light emitting material is enhanced, thereby solving a problem where organic light emitting materials move to and are accumulated into an area adjacent to the bank 160. As a result, a pile-up phenomenon where a thickness of the organic layer EL is thicker in a boundary surface contacting the bank 160 than a center of a pixel area is prevented.

Moreover, in another embodiment of the present disclosure, since the pile-up phenomenon is prevented without an auxiliary bank being provided, a separate mask process is not added. Also, an anode electrode is prevented from being damaged by an etching solution which is used in a process of etching the auxiliary bank, and thus, a device characteristic of an organic light emitting display device is improved. Also, according to an embodiment of the present disclosure, an aperture ratio of a display panel is not reduced in comparison with the related art where the auxiliary bank is provided.

Figure 5:
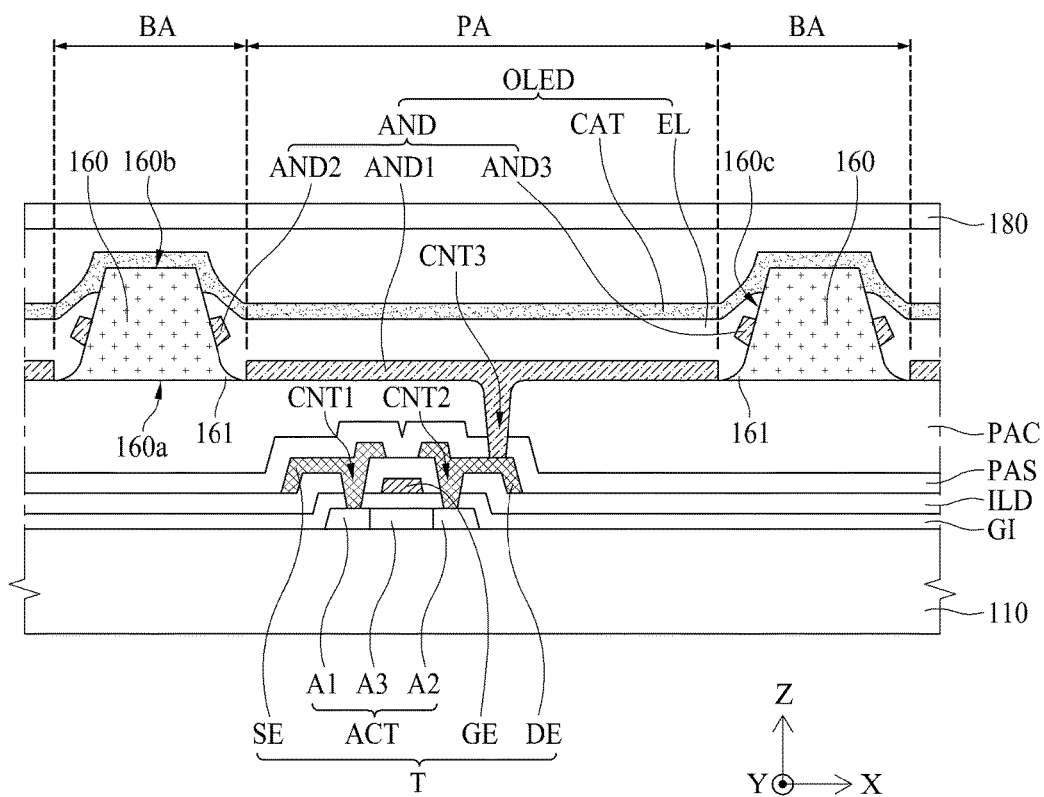
FIG. 5 is a cross-sectional view illustrating one cross-sectional surface of an organic light emitting display device according to another embodiment of the present disclosure.

FIG. 5 is a cross-sectional view illustrating one cross-sectional surface of an organic light emitting display device according to another embodiment of the present disclosure. Except that a first anode electrode AND1 is provided not to cover a protrusion 161 of each of banks 160, the organic light emitting display device according to another embodiment of the present disclosure illustrated in FIG. 5 is the same as another embodiment of the present disclosure described above with reference to FIG. 4. Thus, like reference numerals refer to like elements, and repetitive descriptions of a material and a structure of each element are omitted.

With reference to FIG. 5, a plurality of banks 160 according to another embodiment of the present may each include a protrusion 161. An anode electrode AND may include first to third anode electrodes AND1 to AND3. In this case, the first anode electrode AND1 may be provided not to cover the protrusion 161 included in each of the banks 160. That is, the first anode electrode AND1 according to another embodiment of the present disclosure may be provided in only a pixel area PA of an organic light emitting display panel. An organic layer EL may cover a whole top of the first anode electrode AND1. Particularly, the organic layer EL may cover one end and the other end of the first anode electrode AND1. Accordingly, the one end and the other end of the anode electrode AND1 are not exposed to the outside.

According to another embodiment of the present disclosure illustrated in FIG. 5, the same effect as another embodiment of the present disclosure illustrated in FIG. 5 is obtained. That is, according to another embodiment of the present disclosure, a leakage current is more stably prevented from occurring in one end and the other end of the anode electrode AND.

Moreover, according to another embodiment of the present disclosure, a spreadability of an organic light emitting material is enhanced, thereby preventing the pile-up phenomenon where a thickness of the organic layer EL is thicker in a boundary surface contacting each of the banks 160 than a center of the pixel area PA.

Moreover, according to another embodiment of the present disclosure, a separate mask process is not added. Also, an anode electrode is prevented from being damaged by an etching solution which is used in a process of etching an auxiliary bank, and thus, a device characteristic of an organic light emitting display device is improved. Also, according to another embodiment of the present disclosure, an aperture ratio of a display panel is not reduced in comparison with the related art where the auxiliary bank is provided.

Figure 6:
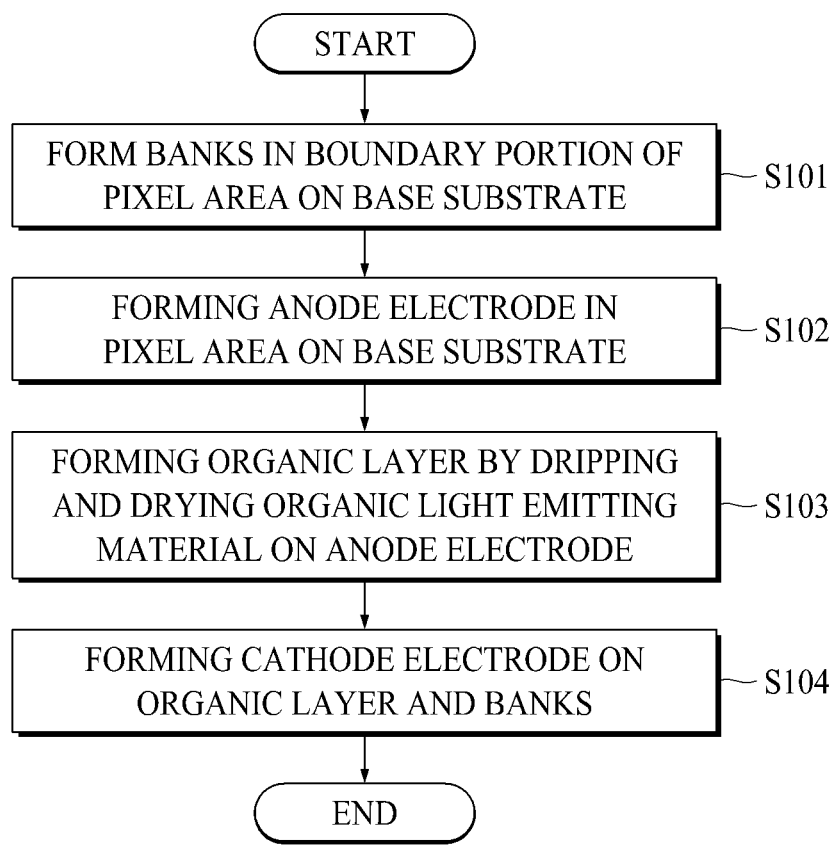
FIG. 6 is a flowchart illustrating a method of manufacturing an organic light emitting display device according to an embodiment of the present disclosure.

FIG. 6 is a flowchart illustrating a method of manufacturing an organic light emitting display device according to an embodiment of the present disclosure. FIGS. 7A to 7D are cross-sectional views illustrating a method of manufacturing an organic light emitting display device according to an embodiment of the present disclosure. FIGS. 6 and 7 relate to a method of manufacturing an organic light emitting display device according to an embodiment of the present disclosure illustrated in FIG. 3. Thus, like reference numerals refer to like elements, and repetitive descriptions of a material and a structure of each element are omitted.

Figure 7A:
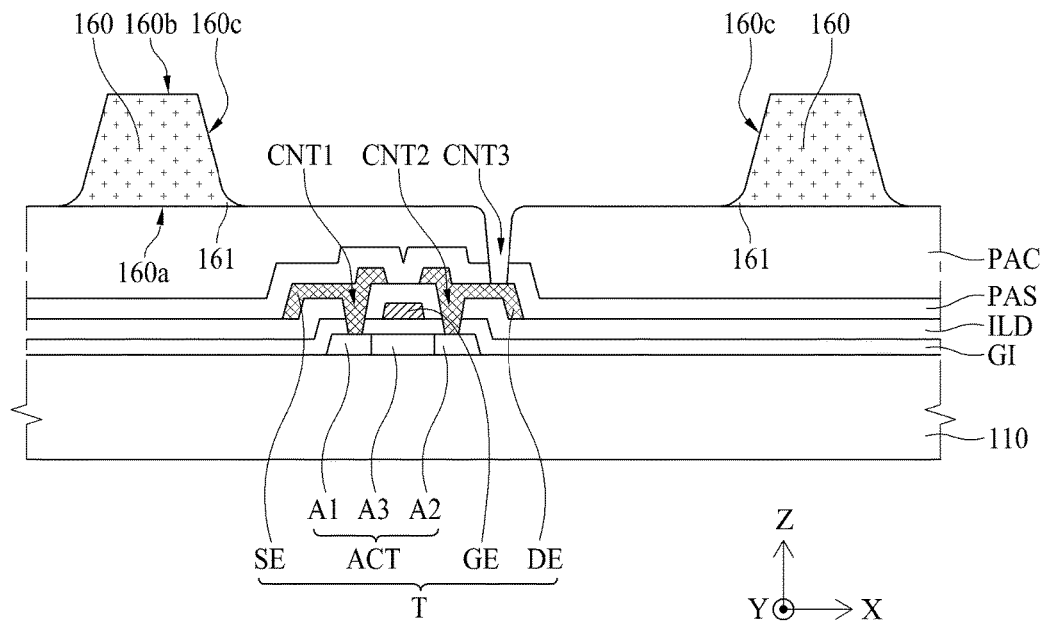
FIGS. 7A to 7D are cross-sectional views illustrating a method of manufacturing an organic light emitting display device according to an embodiment of the present disclosure.

First, as in FIG. 7A, a TFT T, a passivation layer PAS, and a planarization layer PAC may be sequentially formed on a base substrate 110. Subsequently, a plurality of banks 160 may be formed on the planarization layer PAC. The banks 160 may be provided in a boundary area BA of a pixel area PA on the base substrate 110. The banks 160 may be formed through a process where an organic light emitting material having hydrophobicity is coated on the planarization layer PAC, exposed to light by using a photomask, and developed. In this case, each of the banks 160 may have a taper structure, and each of side surfaces 160c of the banks 160 may be inclined. Here, a thickness of each of the banks 160 may be equal to or less than 2 μm, and an inclined angle of each of the side surfaces 160c may be within a range of 5 degrees to 80 degrees. (S101 of FIG. 6)

Figure 7B:
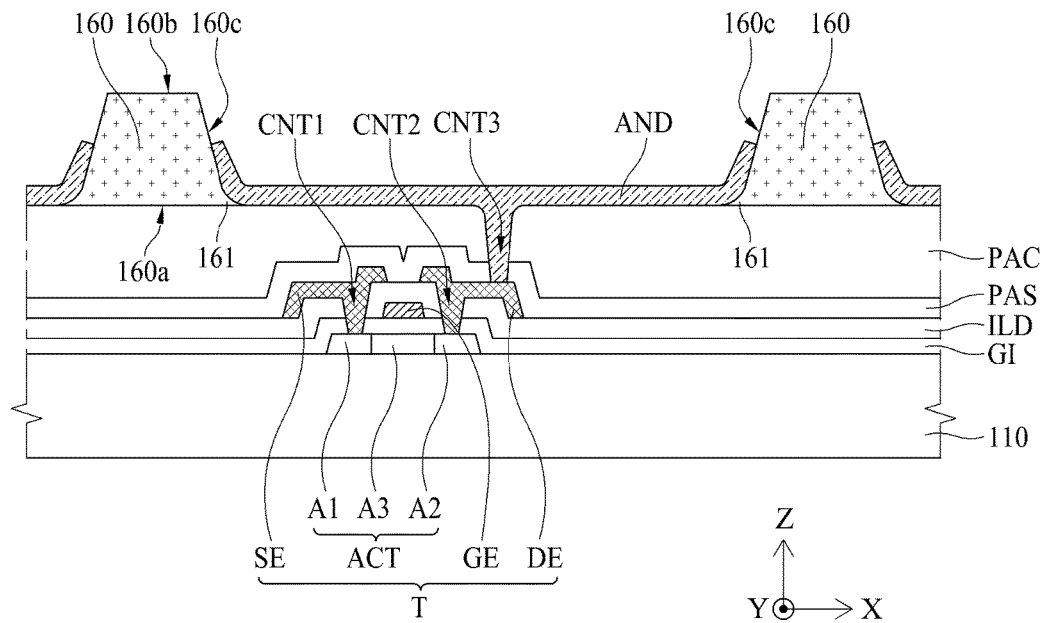

Second, as in FIG. 7B, an anode electrode AND may be formed between adjacent banks 160. The anode electrode AND may be formed in the pixel area PA on the base substrate 110. The anode electrode AND may be formed on the planarization layer PAC exposed between the adjacent banks 160. The anode electrode AND may be provided to cover a portion of each of the side surfaces 160c of the banks 160. In this case, the anode electrode AND may extend to cover a protrusion 161 provided in a lower end of each of the banks 160. The anode electrode AND may be formed by using a sputtering process. (S102 of FIG. 6)

Figure 7C:
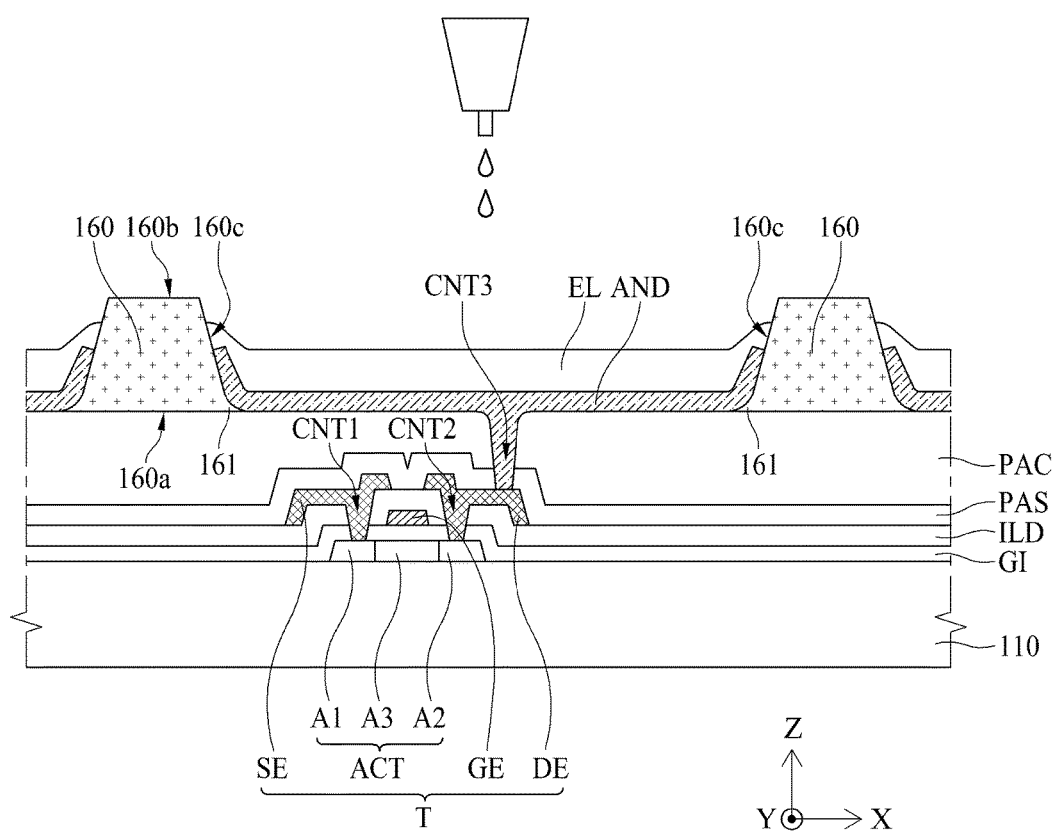

Third, as in FIG. 7C, an organic light emitting material have a solution state may be dripped on the anode electrode AND, and by drying the organic light emitting material, an organic layer EL may be formed. The organic layer EL may be formed by a wet etching process using an inkjet printing process and/or the like. In an embodiment of the present disclosure, the organic layer EL may be formed to cover a whole top of the anode electrode AND. Therefore, one end and the other end of the anode electrode AND may not be exposed to the outside. (S103 of FIG. 6)

Figure 7D:
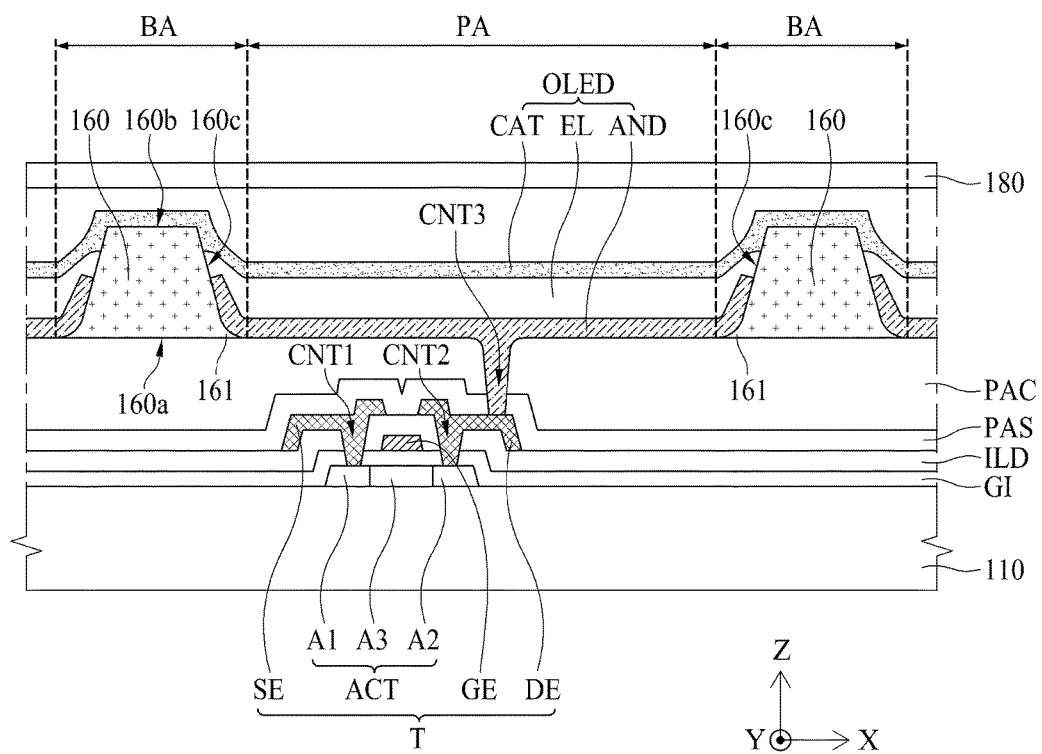

Finally, as in FIG. 7D, a cathode electrode CAT may be formed to cover a top of each of the organic layer EL and the banks 160, and an encapsulation layer 180 may be formed on the cathode electrode CAT. The cathode electrode CAT may use, for example, a metal material such as Ag, Ti, Al, Mo, or an alloy of Ag and Mg, but is not limited thereto. (S104 of FIG. 6)

As described above, in an embodiment of the present disclosure, the anode electrode AND may be provided between adjacent banks 160 to cover the side surfaces 160c of the banks 160, and the organic layer EL may cover the whole top of the anode electrode AND. Accordingly, the pile-up phenomenon is prevented without a separate mask process being added.

As described above, according to the embodiments of the present disclosure, the anode electrode may be provided between adjacent banks to cover side surfaces of the banks, and the organic layer may cover a whole top of the anode electrode. Accordingly, a spreadability of an organic light emitting material is enhanced, thereby preventing the pile-up phenomenon where a thickness of the organic layer is thicker in a boundary surface contacting a bank than a center of a pixel area.

Moreover, according to the embodiments of the present disclosure, since an auxiliary bank is not provided, a mask process is not added in comparison with the related art where the auxiliary bank is provided. Also, a damage of the anode electrode caused by an etching solution applied to a process of etching the auxiliary bank is prevented, and an aperture ratio of the display panel is not reduced and is improved. Accordingly, a device characteristic of the display device is improved.

Moreover, according to the embodiments of the present disclosure, the banks may be first provided on the planarization layer, and the anode electrode may be provided between the banks, thereby preventing a bank residual material from remaining on the anode electrode. Accordingly, a defective image quality of the organic light emitting display device is improved.

Moreover, according to the embodiments of the present disclosure, since the organic layer is provided to cover a whole top of the anode electrode, one end and the other end of the anode electrode are not exposed to the outside. Accordingly, a leakage current does not occur in the one end and the other end of the anode electrode.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An organic light emitting display device, comprising:
a planarization layer planarizing an upper surface of a base substrate;
a plurality of banks on the planarization layer and in a boundary portion of a pixel area on the base substrate;
an anode electrode in a pixel area on the base substrate;
an organic layer on the anode electrode; and
a cathode electrode on the organic layer and the plurality of banks,
wherein the anode electrode is between the plurality of banks and covers a side surface of each of the plurality of banks adjacent to the anode electrode,
wherein each of the plurality of banks comprises a protrusion protruding in a direction from a side surface contacting the lower surface of each bank to the pixel area, and
wherein a lower surface of the protrusion contacts an upper surface of the planarization layer.

2. The organic light emitting display device of claim 1, wherein each of the plurality of banks has a taper structure in which a length of a lower surface is longer than a length of an upper surface, and a side surface connecting the lower surface to the upper surface is inclined.

3. The organic light emitting display device of claim 2, wherein the anode electrode is not provided on the upper surface of each of the plurality of banks.

4. The organic light emitting display device of claim 1, wherein the organic layer covers a whole top of the anode electrode.

5. The organic light emitting display device of claim 4, wherein the organic layer covers one end and another end of the anode electrode.

6. The organic light emitting display device of claim 1, wherein the anode electrode covers the protrusion.

7. The organic light emitting display device of claim 1, wherein each of the plurality of banks comprises a material having hydrophobicity.

8. An organic light emitting display device, comprising: a plurality of banks in a boundary portion of a pixel area on a base substrate: wherein each of the plurality of banks comprise a protrusion protruding in a direction from a side surface contacting the lower surface of each bank to the pixel area; an anode electrode in a pixel area on the base substrate: an organic layer on the anode electrode; and a cathode electrode on the organic layer and the plurality of banks, wherein the anode electrode is between the plurality of banks and covers a side surface of each of the plurality of banks adjacent to the anode electrode, wherein the anode electrode comprises: a first anode electrode between the plurality of banks; and second and third anode electrodes disposed with the first anode electrode there between and spaced apart from the first and electrode by a certain distance, and wherein the first anode electrode covers the protrusion, and the second and third anode electrodes are respectively provided on the side surfaces of the plurality of banks.

9. An organic light emitting display device, comprising: a plurality of banks in a boundary portion of a pixel area on a base substrate: wherein each of the plurality of banks comprise a protrusion protruding in a direction from a side surface contacting the lower surface of each bank to the pixel area; an anode electrode in a pixel area on the base substrate: an organic layer on the anode electrode; and a cathode electrode on the organic layer and the plurality of banks, wherein the anode electrode is between the plurality of banks and covers a side surface of each of the plurality of banks adjacent to the anode electrode, wherein the anode electrode comprises: a first anode electrode between the plurality of banks; and second and third anode electrodes disposed with the first anode electrode there between and spaced apart from the first and electrode by a certain distance, and wherein the first anode electrode does not cover the protrusion, and the second and third anode electrodes are respectively provided on the side surfaces of the plurality of banks.

10. The organic light emitting display device of claim 9, wherein the organic layer covers a whole top of each of the first to third anode electrodes.

11. The organic light emitting display device of claim 8, wherein the organic layer covers a whole top of each of the first to third anode electrodes.

* * * * *